United States Patent
Shimizu et al.

(10) Patent No.: US 12,356,557 B2
(45) Date of Patent: Jul. 8, 2025

(54) METHOD FOR MANUFACTURING WIRING SUBSTRATE

(71) Applicant: IBIDEN CO., LTD., Gifu (JP)

(72) Inventors: Keisuke Shimizu, Ogaki (JP); Kohei Suzuki, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 423 days.

(21) Appl. No.: 17/723,638

(22) Filed: Apr. 19, 2022

(65) Prior Publication Data

US 2022/0346240 A1 Oct. 27, 2022

(30) Foreign Application Priority Data

Apr. 23, 2021 (JP) .................. 2021-073482

(51) Int. Cl.
| | |
|---|---|
| H05K 3/28 | (2006.01) |
| C23C 18/16 | (2006.01) |
| C23C 28/00 | (2006.01) |
| C25D 5/02 | (2006.01) |
| C25D 7/00 | (2006.01) |
| H05K 3/00 | (2006.01) |
| H05K 3/40 | (2006.01) |
| H05K 3/46 | (2006.01) |

(52) U.S. Cl.
CPC ....... *H05K 3/4644* (2013.01); *C23C 18/1603* (2013.01); *C23C 28/00* (2013.01); *C25D 5/02* (2013.01); *C25D 7/00* (2013.01); *H05K 3/0011* (2013.01); *H05K 3/28* (2013.01); *H05K 3/40* (2013.01)

(58) Field of Classification Search
None
See application file for complete search history.

(56) References Cited

U.S. PATENT DOCUMENTS

| | | | |
|---|---|---|---|
| 2006/0252249 A1* | 11/2006 | Hsu | H01L 24/03 257/E21.508 |
| 2007/0186412 A1* | 8/2007 | Hsu | H05K 3/3485 29/830 |
| 2008/0149379 A1* | 6/2008 | Nagase | H01L 24/24 257/E23.178 |

(Continued)

FOREIGN PATENT DOCUMENTS

JP 2010-129996 A 6/2010

*Primary Examiner* — Stefanie S Wittenberg
(74) *Attorney, Agent, or Firm* — Finnegan, Henderson, Farabow, Garrett & Dunner, LLP (57) ABSTRACT

A method for manufacturing a wiring substrate includes forming a conductor layer including first and second pads, forming a resin insulating layer on the conductor layer, forming, in the insulating layer, a first opening exposing the first pad and a second opening exposing the second pad, forming a covering layer on the insulating layer such that the covering layer covers the first and second openings, forming a third opening in the covering layer such that the third opening communicates with the first opening and the first pad is exposed in the third opening, forming, on a surface of the first pad, a protective film formed of material different from material forming the conductor layer, removing the covering layer from the insulating layer, and forming a conductor post on the second pad such that the conductor post is formed of material that is same as the material forming the conductor layer.

20 Claims, 10 Drawing Sheets

(56) References Cited

U.S. PATENT DOCUMENTS

| | | | |
|---|---|---|---|
| 2014/0000951 A1* | 1/2014 | Ryu | H05K 3/4007 |
| | | | 205/125 |
| 2014/0137989 A1* | 5/2014 | Huang | C25D 5/10 |
| | | | 148/518 |
| 2015/0271929 A1* | 9/2015 | Noda | C25D 7/123 |
| | | | 205/123 |
| 2017/0034911 A1* | 2/2017 | Otsubo | H01L 23/145 |
| 2019/0394877 A1* | 12/2019 | Ishiguro | H05K 3/4673 |

* cited by examiner

METHOD FOR MANUFACTURING WIRING SUBSTRATE

CROSS-REFERENCE TO RELATED APPLICATIONS

The present application is based upon and claims the benefit of priority to Japanese Patent Application No. 2021-073482, filed Apr. 23, 2021, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2010-129996 describes a substrate having metal posts. The metal posts are formed on connection pads exposed in opening parts formed in a solder resist layer, and fill the opening parts. The metal posts are formed on all of the connection pads provided in the substrate. The entire contents of this publication are incorporated herein by reference.

SUMMARY OF THE INVENTION

According to one aspect of the present invention, a method for manufacturing a wiring substrate includes forming a conductor layer including a first conductor pad and a second conductor pad, forming a resin insulating layer on the conductor layer such that the resin insulating layer covers the conductor layer, forming a first opening and a second opening in the resin insulating layer such that the first opening exposes the first conductor pad and that the second opening exposes the second conductor pad, forming a covering layer on the resin insulating layer such that the covering layer covers the first opening and the second opening formed in the resin insulating layer, forming a third opening in the covering layer such that the third opening communicates with the first opening and that the first conductor pad is exposed in the third opening, forming a protective film on a surface of the first conductor pad exposed in the third opening such that the protective film is formed of a material that is different from a material forming the conductor layer, removing the covering layer from the resin insulating layer, and forming a conductor post on the second conductor pad such that the conductor post is formed of a material that is same as the material forming the conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
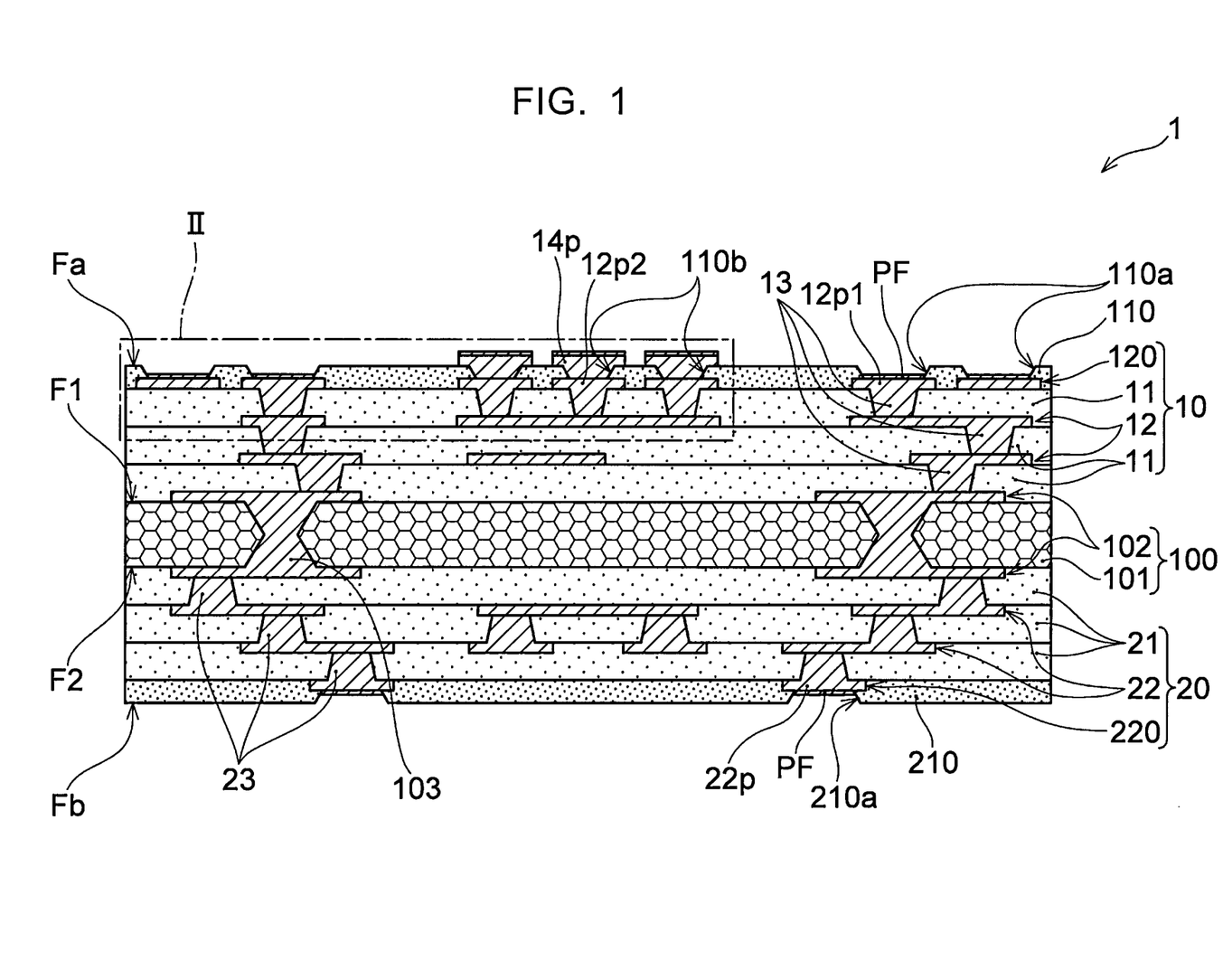
FIG. 1 is a cross-sectional view illustrating an example of a wiring substrate manufactured using a method according to an embodiment of the present invention.

A wiring substrate manufactured using a method for manufacturing a wiring substrate, which is an embodiment of the present invention, is described with reference to the drawings. The drawings to be referred to below are drawn such that features of the present invention can be easily understood, without intending to show exact proportions of structural elements. FIG. 1 illustrates a cross-sectional view of a wiring substrate 1 as an example of a wiring substrate manufactured using the manufacturing method of the embodiment.

The wiring substrate 1 in the example illustrated in FIG. 1 includes a core substrate 100 that includes an insulating layer (core insulating layer) 101 and conductor layers (core conductor layers) 102 formed on both sides of the core insulating layer 101. On each of both sides of the core substrate 100, insulating layers and conductor layers are alternately laminated. In the illustrated example, a first build-up part 10 in which insulating layers 11 and conductor layers (12, 120) are laminated is formed on a one-surface (F1) of the core substrate 100. Further, a second build-up part 20 in which insulating layers 21 and conductor layers (22, 220) are laminated is formed on the other surface (F2) of the core substrate 100.

A solder resist layer 110 is formed on the first build-up part 10. A solder resist layer 210 is formed on the second build-up part 20. Openings (110a, 110b) are formed in the solder resist layer 110, and conductor pads (12p1, 12p2) of the outermost conductor layer 120 in the first build-up part 10 are exposed in the openings (110a, 110b). Openings (210a) are formed in the solder resist layer 210, and conductor pads (22p) of the outermost conductor layer 220 in the second build-up part 20 are exposed in the openings (210a).

Conductor posts (14p) are formed on the conductor pads (12p2) among the multiple conductor pads (12p1, 12p2) of the outermost conductor layer 120 in the first build-up part 10 of the wiring substrate 1. The conductor posts (14p) fill the openings (110b) that expose therein the conductor pads (12p2), and form a part of an outermost surface of the wiring substrate 1. In a wiring substrate manufactured using the manufacturing method of the embodiment, as will be described in detail later with reference to FIG. 2, a protective film (PF) is formed on upper surfaces of the conductor pads (12p1), which are exposed on the outermost surface of the wiring substrate 1 and on which no conductor posts (14p) are formed. Further, no protective film (PF) is formed on upper surfaces of the conductor pads (12p2) on which the conductor posts (14p) are formed, and the conductor posts (14p) are formed directly on the conductor pads (12p2).

In the description of the method for manufacturing a wiring substrate of the embodiment and a wiring substrate to be manufactured, the outermost conductor layer 120 of the first build-up part 10 in the wiring substrate 1 is also referred to as the first conductor layer 120. The solder resist layer 110 that covers the first conductor layer 120 is also referred to as the first resin insulating layer 110. Further, the outer most conductor layer 220 of the second build-up part 20 in the wiring substrate 1 is also referred to as the second conductor layer 220, and the solder resist layer 210 that covers the second conductor layer 220 is also referred to as the second resin insulating layer 210. Among the multiple conductor pads (12p1, 12p2) included in the first conductor layer 120, the conductor pads (12p1) exposed on the surface of the wiring substrate 1 are also referred to as the first conductor pads (12p1), and the openings (110a) that expose the first conductor pads (12p1) are also referred to as the first openings (110a). The conductor pads (12p2) on which the conductor posts (14p) are formed are also referred to as the second conductor pads (12p2), and the openings (110b) filled with the conductor posts (14p) are also referred to as the second openings (110b). The openings (210a) of the second resin insulating layer 210 that exposes the conductor pads (22p) included in the second conductor layer 220 are also referred to as the fourth openings (210a).

In the description of the wiring substrate 1 and the method for manufacturing the wiring substrate 1, a side farther from the core insulating layer 101 is referred to as "upper," "upper side," "outer side," or "outer," and a side closer to the core insulating layer 101 is referred to as "lower," "lower side," "inner side," or "inner." Further, for the conductor layers and the insulating layers, a surface facing the opposite side with respect to the core substrate 100 is also referred to as an "upper surface," and a surface facing the core substrate 100 side is also referred to as a "lower surface." Therefore, in the description of the wiring substrate manufactured using the manufacturing method of the embodiment, the surface of the first conductor layer 120 exposed from the first and second openings (110a, 110b) of the first resin insulating layer 110 is also referred to as the upper surfaces of the first and second conductor pads (12p1, 12p2), and surfaces of the conductor posts (14p) on the opposite side with respect to the first conductor layer 120 are also referred to as upper surfaces of the conductor posts (14p). A surface of the second conductor layer 220 exposed from the fourth openings (210a) of the second resin insulating layer 210 is also referred to as upper surfaces of the conductor pads (22p).

In the illustrated example, the outermost surface of the wiring substrate 1 formed by exposed surfaces of the conductor pads (12p1, 12p2), the solder resist layer 110, and the conductor posts (14p) is also referred to as a first surface (Fa). The outermost surface of the wiring substrate 1 that is on the opposite side with respect to the first surface (Fa) and is formed by exposed surfaces of the solder resist layer 210 and the conductor pads (22p) is also referred to as a second surface (Fb). That is, the wiring substrate 1 has the first surface (Fa) and the second surface (Fb) on the opposite side with respect to the first surface (Fa) as two surfaces that extend in a direction orthogonal to a thickness direction of the wiring substrate 1.

The conductor layers (102, 12, 120, 22, 220) of the wiring substrate 1 are patterned to have any conductor patterns. In the illustrated example, in the first conductor layer 120, the first conductor pads (12p1) exposed on the first surface (Fa) are formed to have patterns that can be electrically and mechanically connected to connection terminals of a component that can be mounted on the wiring substrate 1 when the wiring substrate 1 is used. Further, in the first conductor layer 120, the second conductor pads (12p2) are formed to have patterns that can be connected via the conductor posts (14p) to connection terminals of a component that can be mounted on the wiring substrate 1 when the wiring substrate 1 is used.

That is, the conductor pads (12p1) and conductor posts (14p), which form the first surface (Fa), are used as connection parts when external components are mounted on the wiring substrate 1, and the first surface (Fa) of the wiring substrate 1 can be a component mounting surface on which multiple components can be mounted. Electrodes of external components can be electrically and mechanically connected to the conductor posts (14p) and the conductor pads (12p1), for example, via a bonding material (not illustrated in the drawings) such as solder. As an external component, an electronic component such as a bare chip semiconductor can be mounted on the component mounting surface. When the wiring substrate 1 is used, a component that can be connected to the first conductor pads (12p1) and a component that can be connected to the second conductor pads (12p2) can be different from each other.

The second surface (Fb), which is a surface on the opposite side with respect to the first surface (Fa) of the wiring substrate 1 in the example illustrated in FIG. 1, can be a connection surface that is connected, for example, to an external element such as a motherboard of any electrical device when the wiring substrate 1 is mounted on the external element. Further, similarly to the first surface (Fa), the second surface (Fb) may be a component mounting surface on which an electronic component such as a semiconductor integrated circuit device is mounted. Without being limited to these, the conductor pads (22p) forming the second surface (Fb) can be connected to any substrate, electrical component, mechanism element, or the like. A protective film (PF) similar to the protective film (PF) formed on the upper surfaces of the first conductor pads (12p1) that form the first surface (Fa) can be formed on the upper surfaces of the conductor pads (22p) that form the second surface (Fb).

In the insulating layer 101 of the core substrate 100, through-hole conductors 103 are formed connecting the conductor layer 102 that forms the one-surface (F1) of the core substrate 100 and the conductor layer 102 that forms the other-surface (F2) in the core substrate 100. In the insulating layers (11, 21), via conductors (13, 23) connecting the conductor layers sandwiching the insulating layers (11, 21) are formed. In the illustrated example, the through-hole conductors 103 each have a tapered shape that is reduced in diameter from both the one-surface (F1) side and the other-surface (F2) side toward a center portion in a thickness direction of the core substrate 100, and the via conductors (13, 23) each have a tapered shape that is reduced in diameter from an outer side toward an inner side of the wiring substrate. It is also possible that the through-hole conductors 103 are formed to each have substantially the same diameter in a length direction (the thickness direction of the core substrate 100), or to each have a tapered shape that is reduced in diameter from one side toward the other side (for example, from the one-surface (F1) toward the other-surface (F2)).

The conductor layers (102, 12, 120, 22, 220), the via conductors (13, 23), the through-hole conductors 103, and the conductor posts (14p) are formed using any metal such as copper or nickel, and, for example, are each formed of a metal foil such as a copper foil and/or a metal film formed by plating or sputtering or the like. The conductor layers (102, 12, 120, 22, 220), the via conductors (13, 23), the through-hole conductors 103, and the conductor posts (14p) are each illustrated in FIG. 1 as having a single-layer structure, but can each have a multilayer structure that includes two or more metal layers. For example, the conductor layers 102 that are respectively formed on the surfaces of the insulating layer 101 can each have a three-layer structure including a metal foil, a metal film (for example, an electroless plating film), and a plating film (for example, an electrolytic plating film). Further, the conductor layers (12, 120, 22, 220), the via conductors (13, 23), the through-hole conductors 103, and the conductor posts (14p) can each have, for example, a two-layer structure including a metal film and an electrolytic plating film.

The insulating layers (101, 11, 21) are each formed using an insulating resin such as an epoxy resin, a bismaleimide triazine resin (BT resin) or a phenol resin. The insulating layers may each contain a reinforcing material (core material) such as a glass fiber and/or inorganic filler such as silica or alumina. The solder resist layers (110, 210) can each be formed using, for example, a photosensitive epoxy resin or polyimide resin, or the like.

Figure 2:
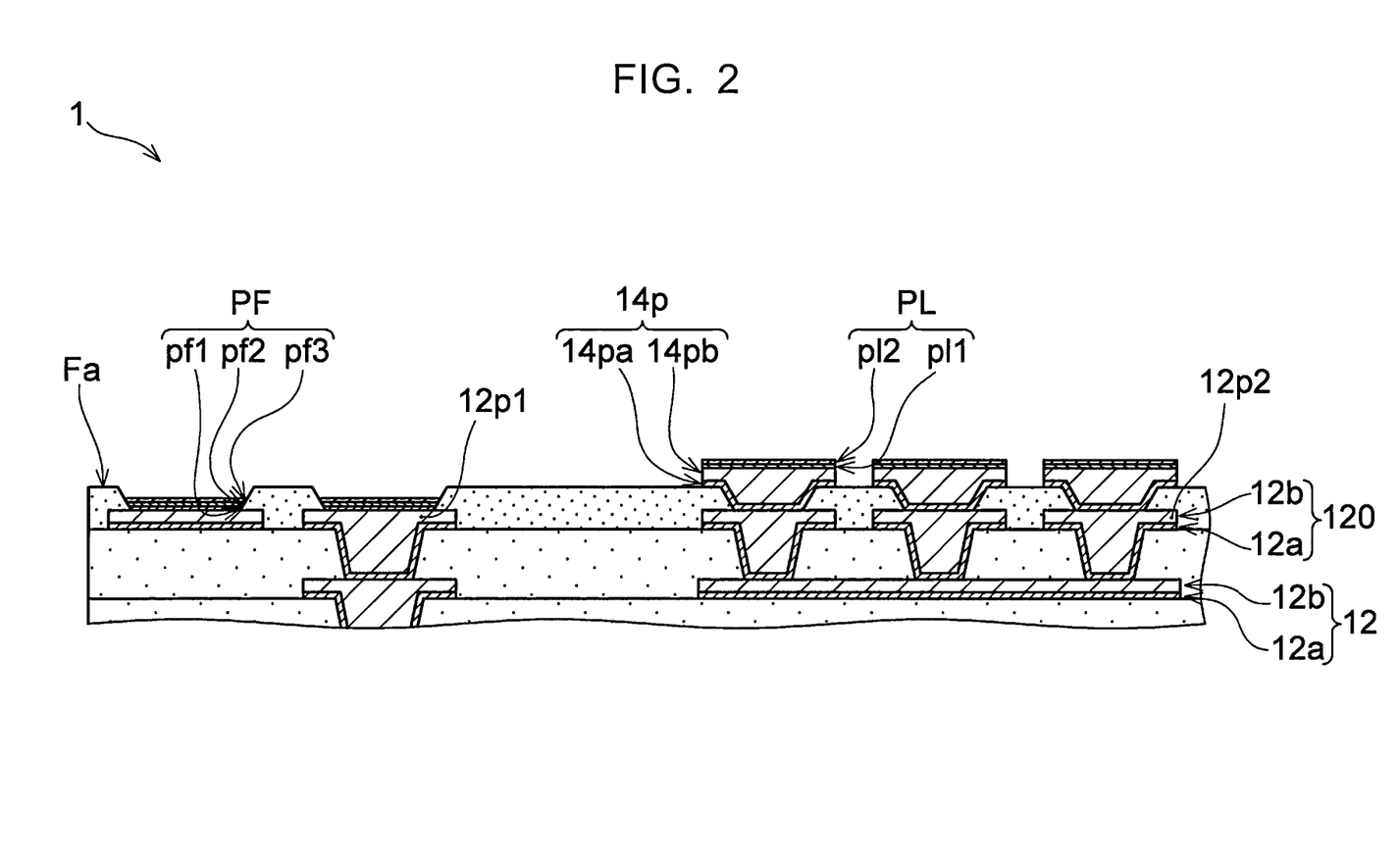
FIG. 2 is a partial enlarged view of the cross-sectional view illustrated in FIG. 1.

FIG. 2 illustrates an enlarged view of a region (II), which is surrounded by a one-dot chain line and includes the first conductor pads (12p1), the second conductor pads (12p2), and the conductor posts (14p), in FIG. 1. In the illustrated enlarged view, an example is illustrated in which the conductor layers (12, 120) each include two layers including a metal film layer (12a) and an electrolytic plating film (12b). The protective film (PF) is formed on the upper surfaces of the first conductor pads (12p1) in the first conductor layer 120 of the wiring substrate 1. The protective film (PF) is formed using a material (for example, nickel, palladium, gold, tin, or the like) different from the material (for example, copper) that forms the first conductor pads (12p1).

An example of the protective film (PF) is a film having a multi-layer structure formed using an electroless plating method. In the illustrated example, the protective film (PF) has a three-layer structure including a base layer (pf1), an intermediate layer (pf2), and a surface layer (pf3), and when the first conductor layer 120 contains copper, for example, the base layer (pf1) contains nickel, the intermediate layer (pf2) contains palladium, and the surface layer (pf3) contains gold. The protective film (PF) can also be formed on the surfaces of the conductor pads (22p) (see FIG. 1) that form the second surface (Fb) of the wiring substrate 1 in addition to the first conductor pads (12p1) that form the first surface (Fa) of the wiring substrate 1.

On the other hand, no protective film (PF) is formed on the upper surfaces of the second conductor pads (12p2) on which the conductor posts (14p) are formed. The conductor posts (14p) (specifically, metal films (14pa) that form the conductor posts (14p)) are directly formed on the upper surfaces of the second conductor pads (12p2). In the illustrated example, the conductor posts (14p) are each formed to have a two-layer structure of including a metal film (14pa) and an electrolyte plating film (14pb), and the metal film (14pa) and the electrolytic plating film (14pb) that form the conductor posts (14p) contain the same material (for example, copper) as the second conductor pads (12p2).

In a wiring substrate manufactured using the manufacturing method of the embodiment, among the first conductor pads (12p1) and the second conductor pads (12p2) that form the first conductor layer 120, the upper surfaces of the first conductor pads (12p1) exposed on the surface of the wiring substrate 1 are covered by the protective film (PF). The protective film (PF) is formed of a material different from the material that forms the first conductor pads (12p1). No protective film (PF) is formed on the upper surfaces of the second conductor pads (12p2), and the conductor posts (14p) formed of the same material as the material forming the second conductor pads (12p2) are formed directly on the second conductor pads (12p2). By having this structure, it may be possible that multiple components having different shapes (specifically, having different forms of connection terminals) can be connected with a good quality to the first surface (Fa), which is a component mounting surface.

Specifically, the surfaces of the first conductor pads (12p1) to which external components can be connected are covered by the protective film (PF) and thus corrosion and oxidation of the surfaces can be suppressed. Further, bonding between the second conductor pads (12p2) and the conductor posts (14p) can be realized with relatively high strength due to that materials of the same kind are bonded. Therefore, good connection between the first conductor pads (12p1), which have a good surface condition due to the protective film (PF), and an external component can be satisfactorily realized, and at the same time, due to relatively strong bonding between the conductor posts (14p) and the second conductor pads (12p2), connection between the second conductor pads (12p2) and a component via the conductor posts (14p) can be realized with high reliability.

As illustrated, a plating layer (PL) can be formed on the upper surfaces of the conductor posts (14p). It may be possible that, due to the plating layer (PL), wettability between connecting members (such as solders), which can intervene between the conductor posts (14p) and connecting terminals of an external component, and the conductor posts (14p) is improved. The plating layer (PL) as illustrated has a two-layer structure including a lower layer (pl1) and an upper layer (pl2), and when the conductor posts (14p) contain copper, for example, the lower layer (pl1) can contain nickel and the upper layer (pl2) can contain tin.

In the above description with reference to FIGS. 1 and 2, an example of the wiring substrate 1 is described in which the conductor posts (14p) are formed only on the first surface (Fa) among the first surface (Fa) and the second surface (Fb). However, it is also possible that conductor posts are formed on both the first surface (Fa) and the second surface (Fb). An example in which the conductor posts (14p) are formed on both the first surface (Fa) and the second surface (Fb) is illustrated as a wiring substrate (1a) in FIG. 3. On the first surface (Fa) of the wiring substrate (1a), the first conductor pads (12p1), and the conductor posts (14p) formed on the second conductor pads (12p2), are exposed. On the second surface (Fb) of the wiring substrate (1a), third conductor pads (22p1), and conductor posts (24p) formed on fourth conductor pads (22p2), are exposed.

Figure 3:
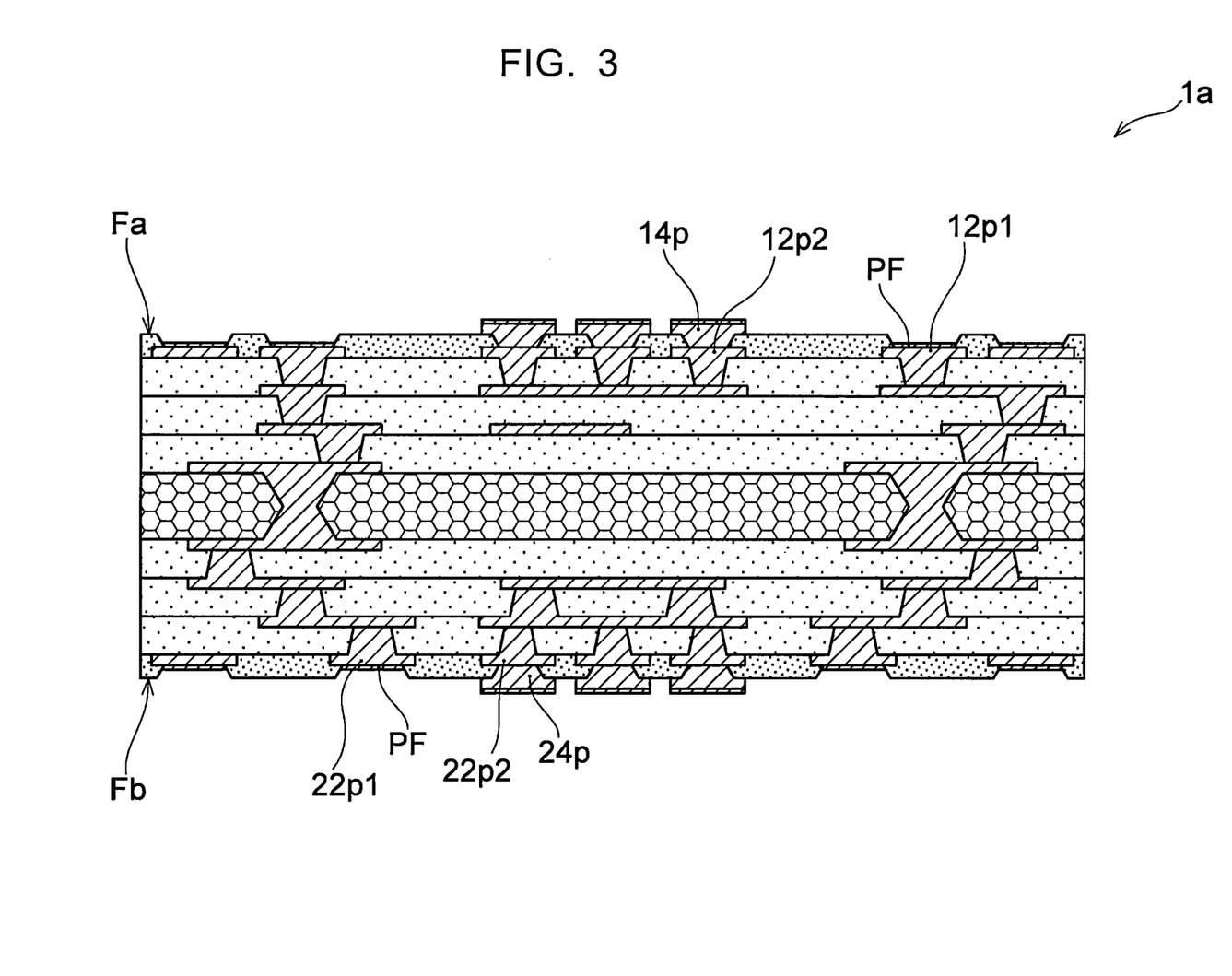
FIG. 3 is a cross-sectional view illustrating another example of a wiring substrate manufactured using a method according to an embodiment of the present invention.

In the wiring substrate (1a) as illustrated, similar to the wiring substrate 1 described above, the protective film (PF) is formed on the first conductor pads (12p1), and no protective film (PF) is formed on the upper surfaces of the second conductor pads (12p2) (that is, interfaces between the second conductor pads (12p2) and the conductor posts (14p)). A protective film (PF) of the same material and structure as the protective film (PF) formed on the surfaces of the first conductor pads (12p1) is formed on the third conductor pads (22p1), and no protective film (PF) is formed on the fourth conductor pads (22p2) on which the conductor posts (24p) are formed. In this way, by having the structure in which the conductor pads (12p1, 22p1) and the conductor posts (14p, 24p) are exposed on both the surfaces (the first surface (Fa) and the second surface (Fb)) of the wiring substrate (1a), it may be possible that multiple electronic components can be mounted on both sides of the wiring substrate (1a) with high reliability.

Figure 4A:
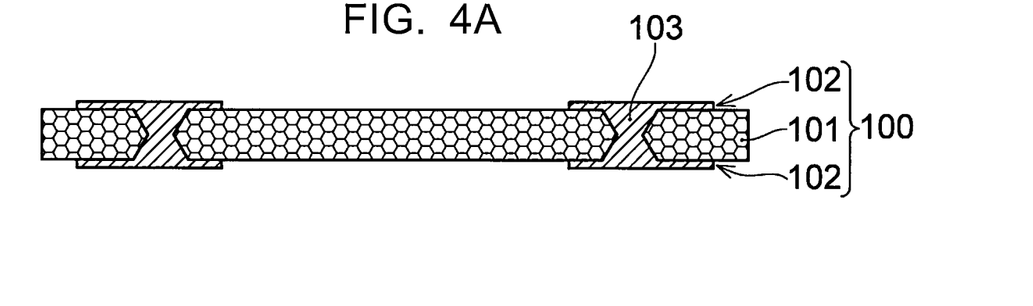
FIG. 4A illustrates an example of a method for manufacturing a wiring substrate according to an embodiment of the present invention.

With reference to FIGS. 4A-4K, a method for manufacturing the wiring substrate of the embodiment is described using a case where the wiring substrate 1 illustrated in FIG. 1 is manufactured as an example. First, as illustrated in FIG. 4A, the core substrate 100 is prepared. In the preparation of the core substrate 100, for example, a double-sided copper-clad laminated plate containing the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 4B:
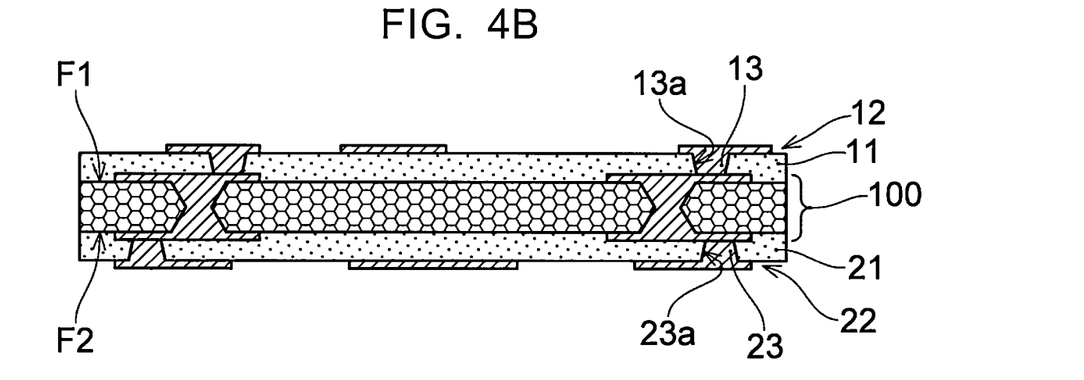
FIG. 4B illustrates an example of a method for manufacturing a wiring substrate according to an embodiment of the present invention.

Next, as illustrated in FIG. 4B, the insulating layer 11 is formed on the one-surface (F1) of the core substrate 100, and the conductor layer 12 is laminated on the insulating layer 11. The insulating layer 21 is formed on the other-surface (F2) of the core substrate 100, and the conductor layer 22 is laminated on the insulating layer 21. For example, the insulating layers (11, 21) are each formed by thermocompression bonding a film-like insulating resin onto the core substrate 100. The conductor layers (12, 22) are formed using any method for forming conductor patterns, such as a semi-additive method, at the same time as the via conductors (13, 23) filling openings (13a, 23a) that can be formed in the insulating layers (11, 21), for example, using laser.

Figure 4C:
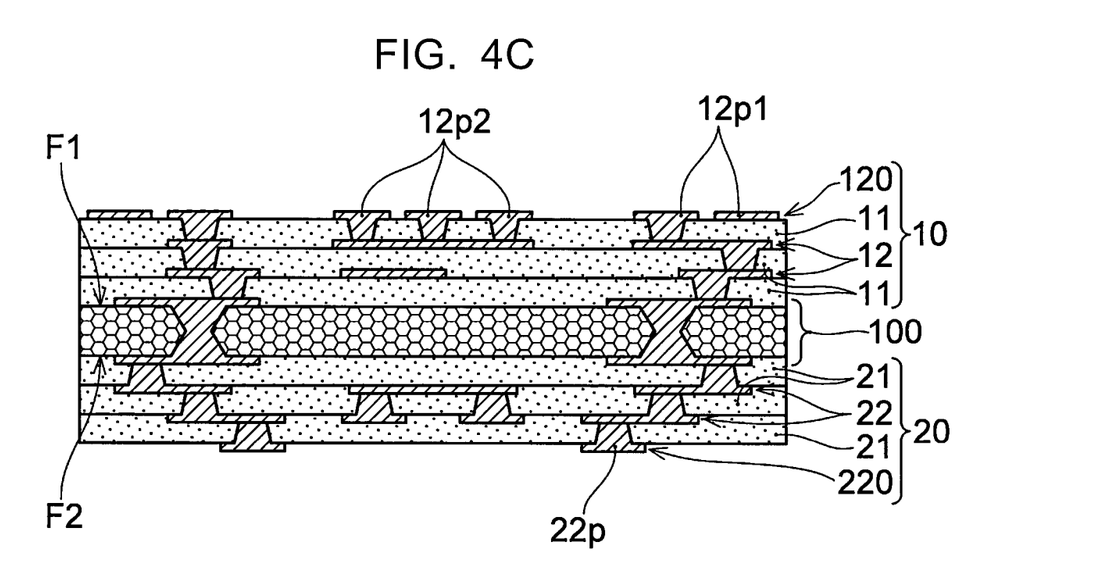
FIG. 4C illustrates an example of a method for manufacturing a wiring substrate according to an embodiment of the present invention.

Subsequently, as illustrated in FIG. 4C, on outer sides of the one-surface (F1) and the other-surface (F2) of the core substrate 100, using the same method as the lamination of the insulating layer 11 and the conductor layer 12 described above, lamination of an insulating layer and a conductor layer is further repeated, and the first build-up part 10 and the second build-up part 20 are formed. The outermost first conductor layer 120 in the first build-up part 10 is formed to have patterns including the first conductor pads (12p1) and the second conductor pads (12p2). The outermost second conductor layer 220 in the second build-up part 20 is formed to have patterns including the conductor pads (22p).

Figure 4D:
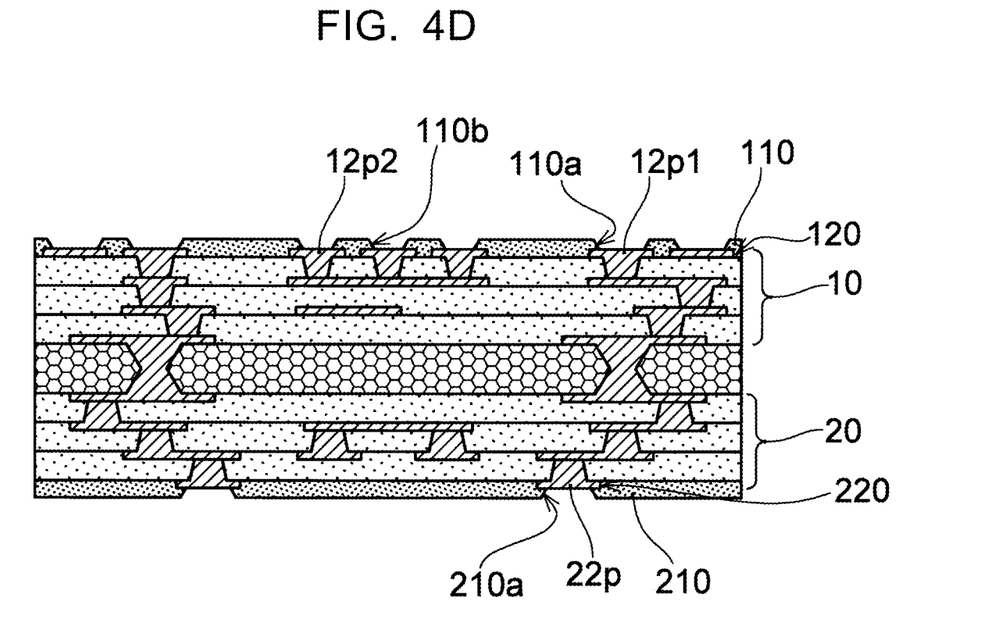
FIG. 4D illustrates an example of a method for manufacturing a wiring substrate according to an embodiment of the present invention.

Next, as illustrated in FIG. 4D, the first resin insulating layer (solder resist layer) 110 covering an upper surface of the first conductor layer 120, which is the outermost conductor layer of the first build-up part 10, is formed. At the same time, the second resin insulating layer (solder resist layer) 210 covering an upper surface of the second conductor layer 220, which is the outermost conductor layer of the second build-up part 20, is formed. For example, a photosensitive epoxy resin film is formed on the first and second conductor layers (120, 220) by spray coating, curtain coating, or film pasting. By exposure and development, the first openings (110a) and the second openings (110b) are formed in the first resin insulating layer 110, and the fourth openings (210a) are formed in the second resin insulating layer 210. The first conductor pads (12p1) are exposed in the first openings (110a) of the first resin insulating layer 110, and the second conductor pads (12p2) are exposed in the second openings (110b) of the first resin insulating layer 110. The conductor pads (22p) are exposed from the fourth openings (210a) of the second resin insulating layer 210.

Figure 4E:
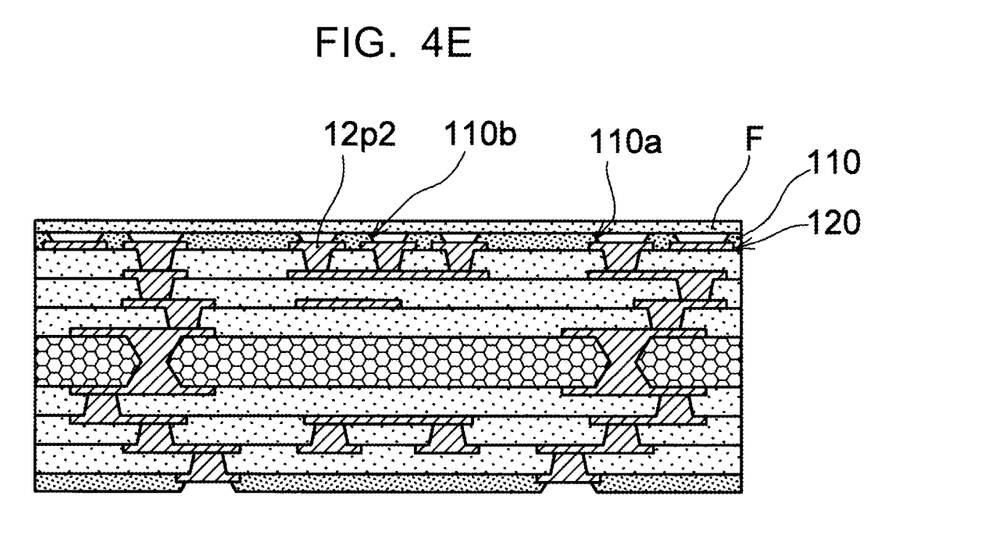
FIG. 4E illustrates an example of a method for manufacturing a wiring substrate according to an embodiment of the present invention.

Next, as illustrated in FIG. 4E, a covering layer (F) is formed on the first resin insulating layer (solder resist layer) 110. The first openings (110a) and the second openings (110b) are closed by the covering layer (F). The covering layer (F) masks the second conductor pads (12p2) from a plating solution in a subsequent process in which a plating film is selectively formed on the surface of the first conductor layer 120. The covering layer (F) can be, for example, a resin film containing polyethylene terephthalate (PET).

Figure 4F:
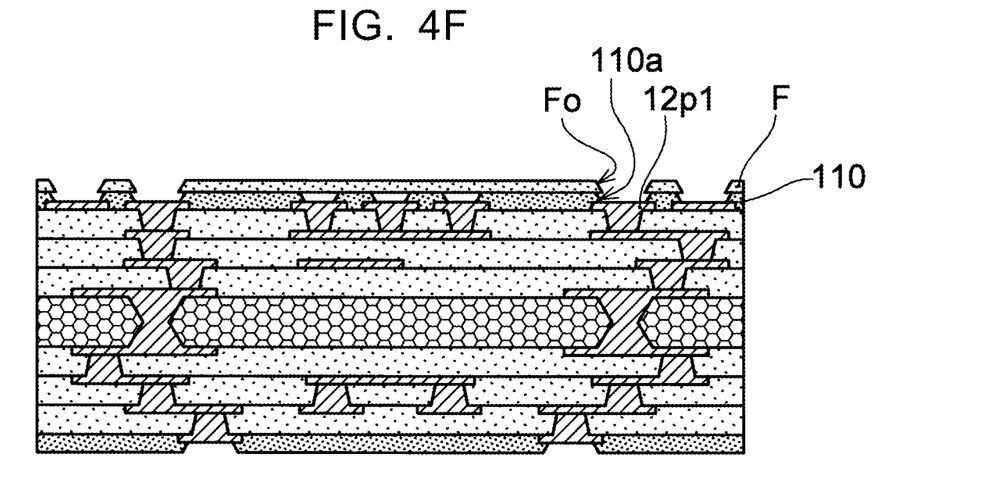
FIG. 4F illustrates an example of a method for manufacturing a wiring substrate according to an embodiment of the present invention.

Next, as illustrated in FIG. 4F, third openings (Fo) communicating with the first openings (110a) are formed in the covering layer (F), and the first conductor pads (12p1) are exposed.

The third openings (Fo) can be formed by irradiating laser such as CO2 laser or YAG laser to positions corresponding to places where the third openings (Fo) of the covering layer (F) are to be formed from above the covering layer (F). For example, laser is irradiated to inner sides of regions that overlap the openings (110a) in a plan view, and the third openings (Fo) formed in the covering layer (F) are smaller in diameter than the openings (110a) as illustrated in the drawing. As a result, damage to the first resin insulating layer 110 by laser can be avoided. The formation of the covering layer (F) having the third openings (Fo) is not limited to forming a resin film and forming holes therein with laser as described above. It is also possible to form a photosensitive dry film on the first resin insulating layer 110 and form openings (Fo) therein by exposure and development.

Figure 4G:
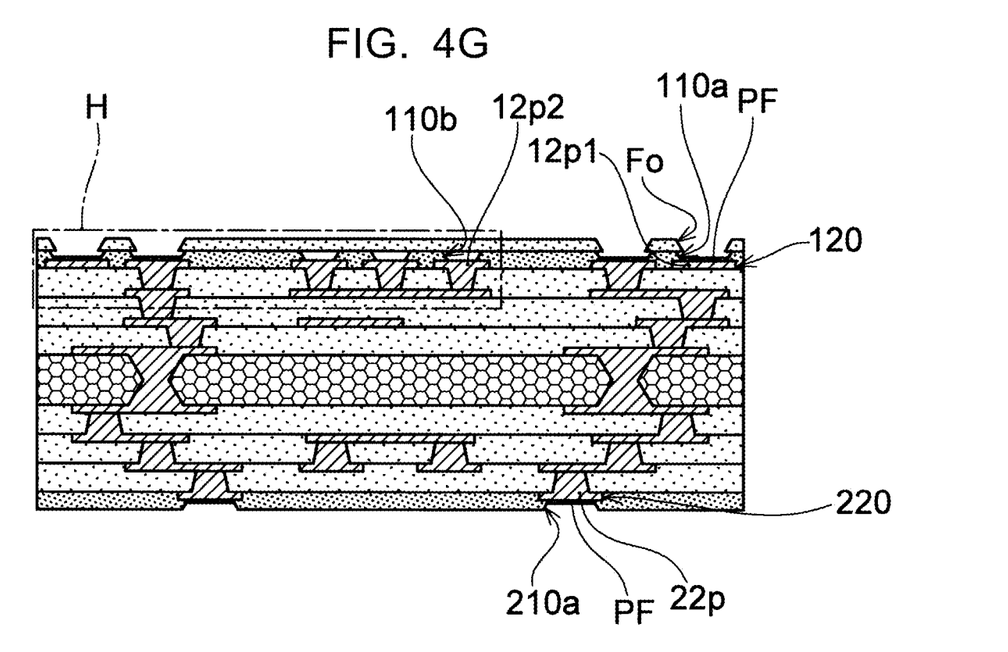
FIG. 4G illustrates an example of a method for manufacturing a wiring substrate according to an embodiment of the present invention.

Next, as illustrated in FIG. 4G, the protective film (PF) is formed on the surfaces of the first conductor pads (12p1) exposed from the third openings (Fo) and the first openings (110a). At the same time, the protective film (PF) is formed on the surfaces of the conductor pads (22p) exposed from the fourth openings (210a) of the second surface (Fb). The protective film (PF) is formed, for example, by electroless plating, and is formed using a material (for example, nickel, palladium, gold, or the like) different from the material (for example, copper) that forms the first and second conductor layers (120, 220). In the process in which the protective film (PF) is formed, the second openings (110b) that expose the second conductor pads (12p2) therein are closed by the covering layer (F). Therefore, the second conductor pads (12p2) are blocked from a plating solution in the process in which the protective film (PF) is formed, and thus, no protective film (PF) is formed on the surfaces of the second conductor pads (12p2). That is, the protective film (PF) is selectively formed only on the first conductor pads (12p1) among the multiple first and second conductor pads (12p1, 12p2) included in the first conductor layer 120.

Figure 4H:
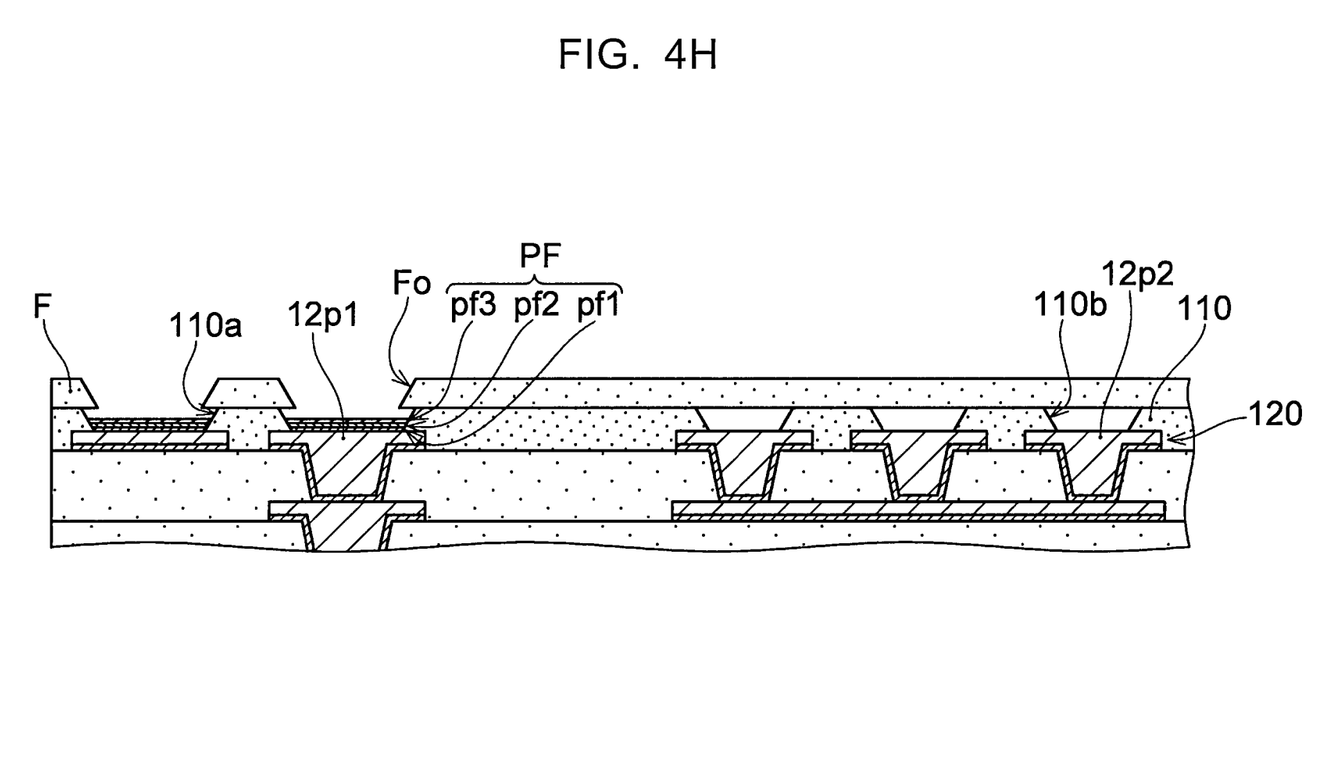
FIG. 4H is a partial enlarged view illustrating an example of a method for manufacturing a wiring substrate according to an embodiment of the present invention.

The process in which the protective film (PF) is formed in the manufacturing method of the embodiment illustrated in FIG. 4G is described in detail with reference to FIG. 4H, which is an enlarged view of a region (H) of FIG. 4G. As illustrated in FIG. 4H, an example is described in which the protective film (PF) formed of three layers including the base layer (pf1), the intermediate layer (pf2) and the surface layer (pf3) is formed on the surfaces of the first conductor pads (12p1).

First, a degreasing and oxide film removal treatment is performed on the upper surfaces of the first conductor pads (12p1) containing, for example, copper, which are exposed from the third openings (Fo) of the covering layer (F), and after that, for example, an electroless nickel plating layer is formed as the base layer (pf1). For example, an electroless nickel plating solution containing a nickel compound and hydrazine or the like is used, and an electroless nickel plating layer is formed on the surfaces of the first conductor pads (12p1). Subsequently, an electroless palladium plating layer is formed as the intermediate layer (pf2) on a surface of the base layer (pf1). For example, a reduced electroless palladium plating solution containing a palladium compound and a hypophosphorous acid compound or the like is used, and an electroless palladium plating layer is formed. Subsequently, for example, an electroless gold plating layer is formed as the surface layer (pf3) on the intermediate layer (pf2). For example, a reduced electroless gold plating solution containing a gold compound and hexamethylenetetramine or the like is used, and an electroless gold plating layer is formed. A layer thickness of each of the base layer (pf1), the intermediate layer (pf2), and the surface layer (pf3) can be adjusted by a concentration of a plating solution, a temperature, an immersion time, and the like.

Figure 4I:
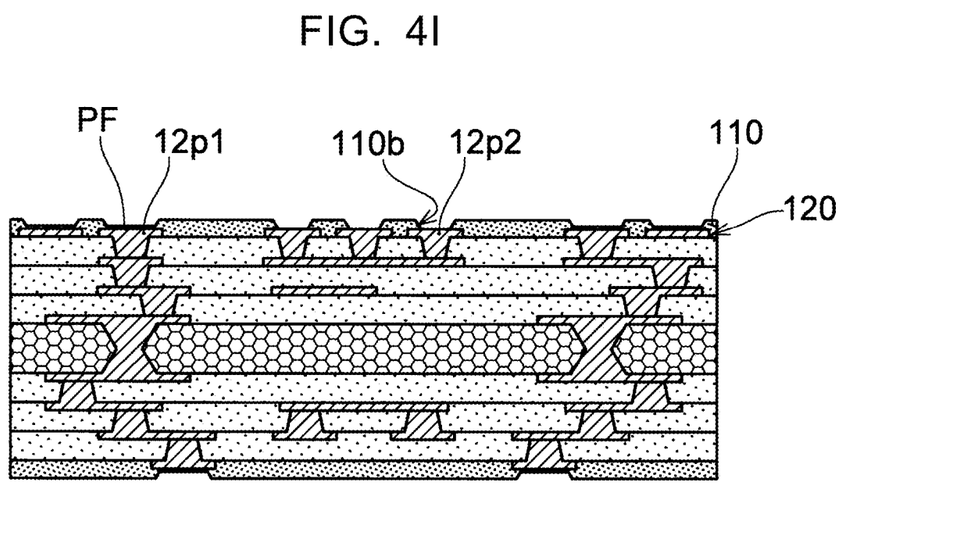
FIG. 4I illustrates an example of a method for manufacturing a wiring substrate according to an embodiment of the present invention.

After the formation of the protective film (PF) on the first conductor pads (12p1), the covering layer (F) is removed from the first resin insulating layer 110. As illustrated in FIG. 4I, by removal of the covering layer (F), the second conductor pads (12p2) are exposed from the second openings (110b), and all the conductor pads (12p1, 12p2) included in the first conductor layer 120 are exposed.

Figure 4J:
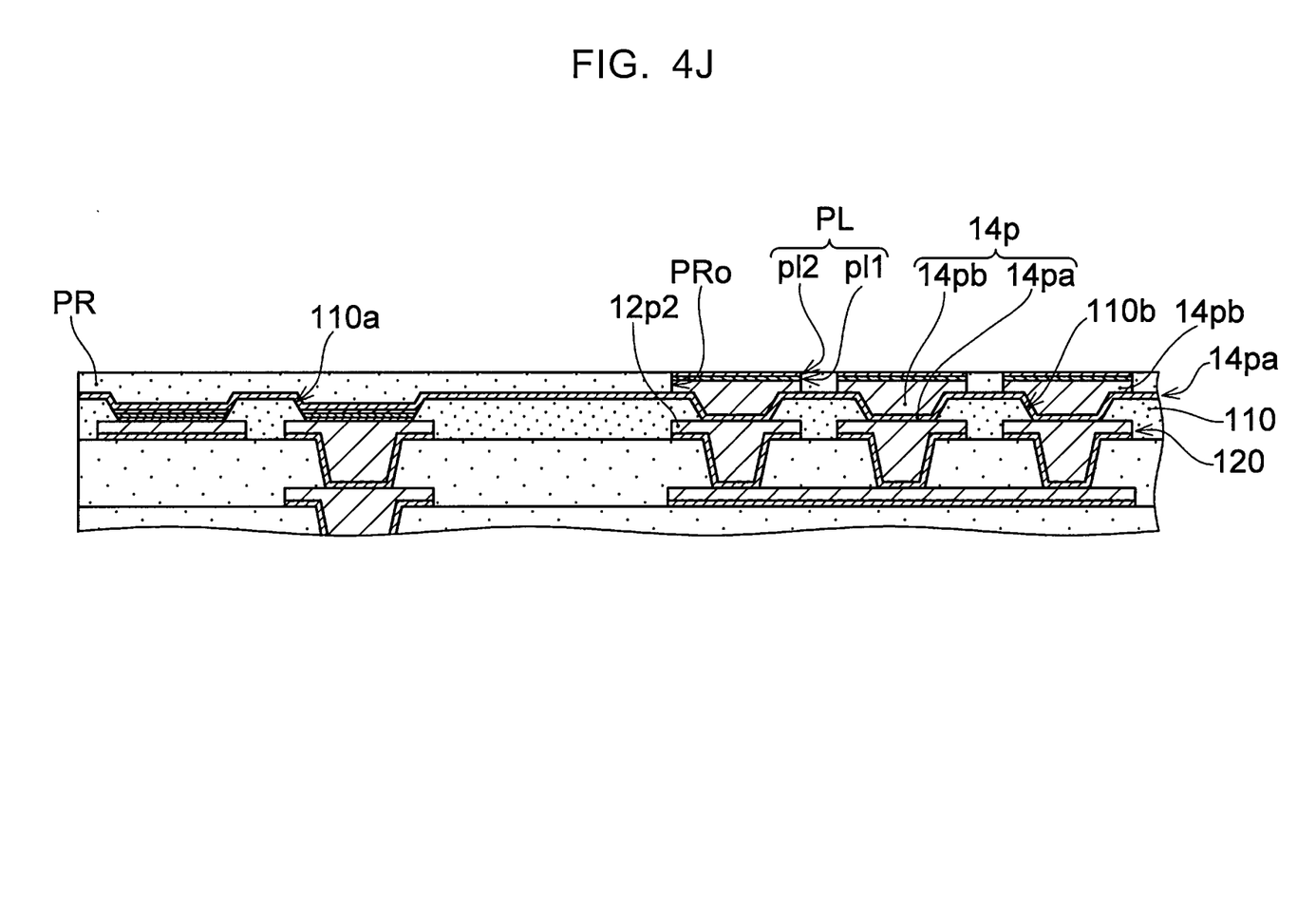
FIG. 4J is a partial enlarged view illustrating an example of a method for manufacturing a wiring substrate according to an embodiment of the present invention.

Next, the conductor posts (14p) are formed on the second conductor pads (12p2) exposed by the removal of the covering layer (F). FIG. 4J illustrates an enlarged view of a vicinity of the second conductor pads (12p2) in the process in which the conductor posts (14p) are formed. For the formation of the conductor posts (14p), for example, a semi-additive method can be used. As illustrated in the drawing, the metal film (14pa) containing the same material (for example, copper) as the material forming the first conductor layer 120 is formed on the upper surface of the first resin insulating layer 110 and the inner surfaces of the openings (110a, 110b). The metal film (14pa) can be formed, for example, by electroless plating or sputtering.

Subsequently, a plating resist (PR) is formed on the metal film (14pa), and, by exposure and development, openings (PRo) that communicate with the second openings (110b) to expose the second conductor posts (12p2) are formed at positions corresponding to positions where the conductor posts (14p) are to be formed. Subsequently, the electrolytic plating film (14pb) is formed by electrolytic plating using the metal film (14pa) as a seed layer. The plating layer (PL) can be formed on an upper surface of the electrolytic plating film (14pb). The plating layer (PL) has, for example, as illustrated in the drawing, a two-layer structure including the lower layer (pl1) and the upper layer (pl2). The lower layer (pl1) is formed, for example, by electrolytic nickel plating, and the upper layer (pl2) is formed, for example, by electrolytic tin plating.

Figure 4K:
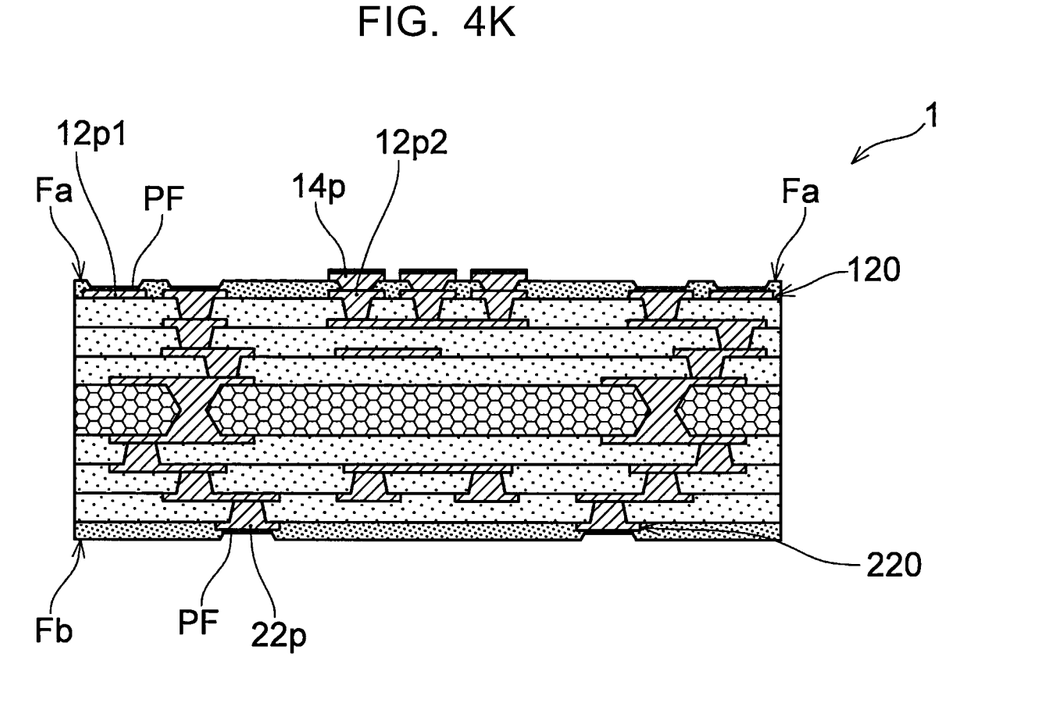
FIG. 4K illustrates an example of a method for manufacturing a wiring substrate according to an embodiment of the present invention.

After the electrolyte plating film (14pb) and the plating layer (PL) are formed, the plating resist (PR) is removed, and the metal film (14pa) exposed by the removal of the plating resist (PR) is removed by quick etching using a strong base solution. As a result, as illustrated in FIG. 4K, the formation of the wiring substrate 1 is completed, in which the first conductor pads (12p1) with the protective film (PF) formed on the surfaces thereof and the conductor posts (14p) formed on the second conductor pads (12p2) are exposed on the first surface (Fa).

In the method for manufacturing the wiring substrate 1, the upper surfaces of the conductor pads (12p1), which are some of the multiple conductor pads (12p1, 12p2) included in the first conductor layer 120, are protected by the protective film (PF). On the other hand, on the second conductor pads (12p2), the conductor posts (14p) are directly formed using the same material as that contained in the second conductor pads (12p2). The second conductor pads (12p2) and the conductor posts (14p) can be firmly bonded. Therefore, as described above, the wiring substrate 1 capable of allowing multiple components to be reliability mounted on the first surface (Fa), which is a component mounting surface, can be provided. After the protective film (PF) is formed on the conductor pads (12p1, 22p), in the process in which the conductor posts (14p) are formed, the second surface (Fb) on which the second conductor layer 220 is exposed can be appropriately protected, for example, by an appropriate protective plate of PET or the like.

The method for manufacturing a wiring substrate of the embodiment is not limited the method described with reference to the drawings. In the manufacturing method of the present embodiment, at least, for the multiple conductor pads (12p1, 12p2) exposed from the openings (110a, 110b) of the first resin insulating layer 110, the protective film (PF) is selectively formed only on the surfaces of the conductor pads (12p1) exposed from the openings (Fo) of the covering layer (F), and the conductor posts (14p) may be directly formed on the conductor pads (12p2). Therefore, a wiring substrate manufactured using the manufacturing method of the embodiment is not limited to the mode in which the first and second build-up parts (10, 20) are formed on both sides of the core substrate 100. It is also possible that the formation of the core substrate 100 and the formation of the second build-up part 20 are omitted.

For example, the method for forming the conductor posts (14p) is not limited to forming the metal film (14pa) and performing electrolytic plating using the metal film (14pa) as a seed layer. It is also possible that the conductor posts (14p) are formed by electroless plating. Conditions, processing order and the like of the manufacturing method described above can be modified as appropriate. Depending on a structure of an actually manufactured wiring substrate, some of the processes may be omitted, or other processes may be added. For example, when the wiring substrate (1a) illustrated in FIG. 3 is manufactured, similar to the second conductor pads (12p2), the fourth conductor pads (22p2) included in the second conductor layer 220 can be masked by a covering layer formed on the second resin insulating layer 210. The protective film (PF) is selectively formed only on the surfaces of the third conductor pads (22p1) exposed from openings formed in the covering layer, and the conductor posts (24p) can be formed on the fourth conductor pads (22p2) without intervention of the protective film (PF).

In the substrate described in Japanese Patent Application Laid-Open Publication No. 2010-129996, the metal posts are formed on all the connection pads. It is thought that it may be difficult to mount multiple electronic components having different shapes on a surface of the substrate on which the connection pads are formed.

A method for manufacturing a wiring substrate, which is an embodiment of the present invention, includes: forming a first conductor layer that includes a first conductor pad and a second conductor pad; forming a first resin insulating layer on the first conductor layer; forming, in the first resin insulating layer, a first opening that exposes the first conductor pad and a second opening that exposes the second conductor pad; providing a covering layer that covers the first opening and the second opening on the first resin insulating layer; forming a third opening in the covering layer on the first opening; forming a protective film on a surface of the first conductor pad exposed in the third opening using a material different from a material of the first conductor layer; removing the covering layer; and forming a conductor post on the second conductor pad. The conductor post is formed using a material that is the same as a material that forms the first conductor layer.

According to the embodiment of the present invention, a wiring substrate can be provided having, on the same component mounting surface, a conductor pad covered by a protective film and a conductor post formed directly on a conductor pad without intervention of a protective film. A wiring substrate can be provided capable of connecting multiple electronic components having different shapes on the same surface with high reliability.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring substrate, comprising:
   forming a conductor layer including a first conductor pad and a second conductor pad;
   forming a resin insulating layer on the conductor layer such that the resin insulating layer covers the conductor layer;
   forming a first opening and a second opening in the resin insulating layer such that the first opening exposes the first conductor pad and that the second opening exposes the second conductor pad;
   forming a covering layer on the resin insulating layer such that the covering layer covers the first opening and the second opening formed in the resin insulating layer;
   forming a third opening in the covering layer such that the third opening communicates with the first opening and that the first conductor pad is exposed in the third opening;
   forming a protective film on a surface of the first conductor pad exposed in the third opening such that the protective film is formed of a material that is different from a material forming the conductor layer;
   removing the covering layer from the resin insulating layer; and
   forming a conductor post on the second conductor pad such that the conductor post is formed of a material that is the same as the material forming the conductor layer,
   wherein the forming of the first opening and a second opening comprises forming the first opening in the resin insulating layer such that the first conductor pad has an exposed surface exposed by the first opening and a peripheral surface covered by the resin insulating layer, the forming of the third opening comprises forming the third opening in the covering layer such that a diameter of the third opening is formed smaller than a diameter of the first opening, and the forming of the protective film comprises forming the protective film on the exposed surface of the first conductor pad.

2. The method for manufacturing a wiring substrate according to claim 1, wherein the forming of the third opening includes irradiating laser upon the covering layer from an opposite side with respect to the first conductor pad of the conductor layer.

3. The method for manufacturing a wiring substrate according to claim 1, wherein the conductor layer and the conductor post are formed of a material comprising copper, and the forming of the conductive post includes forming a metal film on an exposed surface of the second conductor pad, the protective film formed on the exposed surface of the first conductor pad and the resin insulating layer such that the metal film connects the exposed surface of the second conductor pad and the protective film formed on the exposed surface of the first conductor pad.

4. The method for manufacturing a wiring substrate according to claim 1, wherein the conductor layer is formed of a material comprising copper, and the protective film is formed of a material comprising nickel, palladium, and gold.

5. The method for manufacturing a wiring substrate according to claim 1, wherein the forming of the third opening includes irradiating laser upon the covering layer from an opposite side with respect to the first conductor pad of the conductor layer, and the covering layer is a resin film comprising polyethylene terephthalate.

6. The method for manufacturing a wiring substrate according to claim 1, wherein the forming of the conductor post includes forming a layer comprising nickel and tin on a surface of the conductor post.

7. The method for manufacturing a wiring substrate according to claim 1, further comprising:
   forming a second conductor layer on the resin insulating layer on an opposite side with respect to the conductor layer;
   forming a second resin insulating layer on the second conductor layer such that the second resin insulating layer covers the second conductor layer;
   forming a fourth opening in the second resin insulating layer such that the fourth opening exposes the second conductor layer; and
   forming a second protective film on a surface of the second conductor layer exposed in the fourth opening such that the second protective film is formed of a material that is the same as the material forming the protective film and is formed along with the forming of the protective film on the first conductor pad.

8. The method for manufacturing a wiring substrate according to claim 1, wherein the conductor layer and the conductor post are formed of a material comprising copper.

9. The method for manufacturing a wiring substrate according to claim 2, wherein the conductor layer is formed of a material comprising copper, and the protective film is formed of a material comprising nickel, palladium, and gold.

10. The method for manufacturing a wiring substrate according to claim 2, wherein the forming of the third opening includes irradiating laser upon the covering layer from an opposite side with respect to the first conductor pad of the conductor layer, and the covering layer is a resin film comprising polyethylene terephthalate.

11. The method for manufacturing a wiring substrate according to claim 2, wherein the forming of the conductor post includes forming a layer comprising nickel and tin on a surface of the conductor post.

12. The method for manufacturing a wiring substrate according to claim 2, further comprising:
   forming a second conductor layer on the resin insulating layer on an opposite side with respect to the conductor layer;
   forming a second resin insulating layer on the second conductor layer such that the second resin insulating layer covers the second conductor layer;
   forming a fourth opening in the second resin insulating layer such that the fourth opening exposes the second conductor layer; and
   forming a second protective film on a surface of the second conductor layer exposed in the fourth opening such that the second protective film is formed of a material that is same as the material forming the protective film and is formed along with the forming of the protective film on the first conductor pad.

13. The method for manufacturing a wiring substrate according to claim 3, wherein the protective film is formed of a material comprising nickel, palladium, and gold.

14. The method for manufacturing a wiring substrate according to claim 3, wherein the forming of the third opening includes irradiating laser upon the covering layer from an opposite side with respect to the first conductor pad of the conductor layer, and the covering layer is a resin film comprising polyethylene terephthalate.

15. The method for manufacturing a wiring substrate according to claim 3, wherein the forming of the conductor post includes forming a layer comprising nickel and tin on a surface of the conductor post.

16. The method for manufacturing a wiring substrate according to claim 3, further comprising:
   forming a second conductor layer on the resin insulating layer on an opposite side with respect to the conductor layer;
   forming a second resin insulating layer on the second conductor layer such that the second resin insulating layer covers the second conductor layer;
   forming a fourth opening in the second resin insulating layer such that the fourth opening exposes the second conductor layer; and
   forming a second protective film on a surface of the second conductor layer exposed in the fourth opening such that the second protective film is formed of a material that is same as the material forming the protective film and is formed along with the forming of the protective film on the first conductor pad.

17. The method for manufacturing a wiring substrate according to claim 4, wherein the forming of the third opening includes irradiating laser upon the covering layer from an opposite side with respect to the first conductor pad of the conductor layer, and the covering layer is a resin film comprising polyethylene terephthalate.

18. The method for manufacturing a wiring substrate according to claim 4, wherein the forming of the conductor post includes forming a layer comprising nickel and tin on a surface of the conductor post.

19. The method for manufacturing a wiring substrate according to claim 4, further comprising:
   forming a second conductor layer on the resin insulating layer on an opposite side with respect to the conductor layer;
   forming a second resin insulating layer on the second conductor layer such that the second resin insulating layer covers the second conductor layer;
   forming a fourth opening in the second resin insulating layer such that the fourth opening exposes the second conductor layer; and
   forming a second protective film on a surface of the second conductor layer exposed in the fourth opening such that the second protective film is formed of a material that is same as the material forming the protective film and is formed along with the forming of the protective film on the first conductor pad.

20. The method for manufacturing a wiring substrate according to claim 5, wherein the forming of the conductor post includes forming a layer comprising nickel and tin on a surface of the conductor post.

* * * * *